United States Patent
Bailey et al.

(10) Patent No.: US 11,519,401 B2
(45) Date of Patent: Dec. 6, 2022

(54) MODULAR VACUUM PUMPING AND/OR ABATEMENT SYSTEM

(71) Applicant: Edwards Limited, Burgess Hill (GB)

(72) Inventors: Christopher Mark Bailey, Burgess Hill (GB); Craig Leonard Sands, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 290 days.

(21) Appl. No.: 16/763,519

(22) PCT Filed: Nov. 5, 2018

(86) PCT No.: PCT/GB2018/053211
§ 371 (c)(1),
(2) Date: May 12, 2020

(87) PCT Pub. No.: WO2019/092409
PCT Pub. Date: May 16, 2019

(65) Prior Publication Data
US 2020/0340467 A1    Oct. 29, 2020

(30) Foreign Application Priority Data

Nov. 13, 2017 (GB) ..................................... 1718752
Mar. 27, 2018 (GB) ..................................... 1804937

(51) Int. Cl.
*F04B 23/04* (2006.01)
*F04B 41/06* (2006.01)
(Continued)

(52) U.S. Cl.
CPC ............ *F04B 37/14* (2013.01); *F04B 39/121* (2013.01); *F04B 39/123* (2013.01); *F04B 39/14* (2013.01);
(Continued)

(58) Field of Classification Search
CPC .......... F04B 37/14; F04B 23/04; F04B 41/06; F04B 39/121; F04B 39/123; F04B 39/14; F04C 27/00; F04C 23/00; B01D 53/00
See application file for complete search history.

(56) References Cited

U.S. PATENT DOCUMENTS 7,824,500 B1   11/2010 Sarver
2009/0185969 A1*  7/2009 Lose ..................... C01B 23/001
                                                    423/262

(Continued)

FOREIGN PATENT DOCUMENTS

CN    101687131 A    3/2010
CN    102667644 A    9/2012
(Continued)

OTHER PUBLICATIONS

Combined Search and Examination Report under Sections 17 and 18(3) dated Jul. 24, 2018 in counterpart GB application No. 1718752.7, 8 pp.
(Continued)

*Primary Examiner* — Deming Wan
(74) *Attorney, Agent, or Firm* — Shumaker & Sieffert, P.A.

(57) ABSTRACT

A vacuum pumping and/or abatement system for evacuating and/or abating fluid from an entity, the system comprising: a first module comprising a vacuum pumping apparatus for pumping the fluid from the entity and/or an abatement apparatus for abating the fluid evacuated from the entity; and a second module arranged adjacent to the first module in a first system dimension; wherein the first and second modules each have a maximum size in the first system dimension that is a respective integer multiple of a common fixed system value.

20 Claims, 6 Drawing Sheets

(51) Int. Cl.
    *F04B 49/00* (2006.01)
    *F04C 27/00* (2006.01)
    *F04C 23/00* (2006.01)
    *B01D 53/00* (2006.01)
    *F04B 39/12* (2006.01)
    *F04B 37/14* (2006.01)
    *F04B 39/14* (2006.01)
    *F04C 25/02* (2006.01)
    *F04B 41/00* (2006.01)
    *F16L 51/04* (2006.01)
    *F16L 53/35* (2018.01)
    *F16L 23/08* (2006.01)
    *C23C 16/44* (2006.01)

(52) U.S. Cl.
    CPC .............. *F04B 41/00* (2013.01); *F04C 23/00* (2013.01); *F04C 25/02* (2013.01); *F16L 23/08* (2013.01); *F16L 51/04* (2013.01); *F16L 53/35* (2018.01); *C23C 16/4412* (2013.01); *F04C 2240/30* (2013.01); *F04C 2240/70* (2013.01); *F04C 2240/81* (2013.01)

(56) References Cited

U.S. PATENT DOCUMENTS

| | | |
|---|---|---|
| 2010/0119382 A1 | 5/2010 | Scarsdale |
| 2011/0023387 A1 | 2/2011 | Sweeney et al. |
| 2014/0290919 A1 | 10/2014 | Kawamura et al. |
| 2015/0260192 A1* | 9/2015 | Iwasaki ................ B01D 53/323 415/183 |
| 2015/0298094 A1 | 10/2015 | Frye et al. |
| 2016/0045860 A1 | 2/2016 | Stanton |

FOREIGN PATENT DOCUMENTS

| | | |
|---|---|---|
| CN | 104074717 A | 10/2014 |
| CN | 104214101 A | 12/2014 |
| CN | 104902990 A | 9/2015 |
| CN | 105121698 A | 12/2015 |
| DE | 102012112815 A1 | 6/2014 |
| DE | 202015005199 U1 | 8/2015 |
| EP | 2815800 A3 | 12/2014 |
| KR | 20100073338 A | 7/2010 |
| WO | 2008143442 A1 | 11/2008 |
| WO | 2011060415 A2 | 5/2011 |
| WO | 2011095619 A1 | 8/2011 |
| WO | 2016/125114 A1 | 8/2016 |

OTHER PUBLICATIONS

International Preliminary report on Patentability dated Oct. 17, 2019 received in counterpart International Application No. PCT/GB2018/053211, 7 pp.

International Search Report and Written Opinion dated Feb. 11, 2019 received in counterpart International Application No. PCT/GB2018/053211, 12 pp.

Response filed Jun. 12, 2019 to the Written Opinion dated Feb. 11, 2019 received in counterpart International Application No. PCT/GB2018/053211, 9 pp.

"Mensor Model 80 C," Mensor, Retrieved from: http://file.yizimg.com/347334/2013030514190313.pdf, Oct. 26, 2009, 2 pp.

* cited by examiner

MODULAR VACUUM PUMPING AND/OR ABATEMENT SYSTEM

This application is a national stage entry under 35 U.S.C. § 371 of International Application No. PCT/GB2018/053211, filed Nov. 5, 2018, which claims the benefit of GB Application 1804937.9, filed Mar. 27, 2018, and GB Application No. 1718752.7, filed Nov. 13, 2017. The entire contents of International Application No. PCT/GB2018/053211, GB Application 1804937.9, and GB Application 1718752.7 are incorporated herein by reference.

TECHNICAL FIELD

The present disclosure relates to vacuum pumping and/or abatement systems.

BACKGROUND

Vacuum pumping and abatement systems are used in varied and different technological fields, for example semiconductor fabrication. Typically, in said systems, vacuum pumping equipment is used to pump gas (e.g. gas from an industrial process) out of a particular location, and abatement equipment is used to abate (e.g. destroy or dispose of) undesirable substances (e.g. exhaust gas) which have been produced.

Depending on the processes involved, there may be different criteria for vacuum pumping and abatement. For example, it is typically desirable to use different vacuum pumping equipment for different processes involving different process gases, different gas pressures, and different gas flow. Also, it is typically desirable to use different abatement equipment to destroy or dispose of different undesirable substances, or deal with different gas flows.

Vacuum pumping and abatement systems are typically designed bespoke according to the particular processes with which they will be used. However, the amount of time spent designing, manufacturing and installing such a bespoke system is typically prolonged because different processes require different vacuum pumping and abatement system solutions.

SUMMARY

In a first aspect, the present invention provides a modular vacuum pumping and abatement system for evacuating and abating a gas from an entity. The system comprises a plurality of functional modules and a plurality of gas connection lines, each gas connection line for conveying a flow of gas therethrough. The plurality of functional modules comprises a first module comprising a vacuum pumping apparatus for pumping the gas from the entity, and a second module comprising an abatement apparatus for abating the gas pumped from the entity. The first module is positioned adjacent to the second module in a first system dimension. The first and second modules each have a maximum size in the first system dimension that is a respective integer multiple of a common fixed system value (e.g. a value in the range 10 mm-5 cm, e.g. 44 mm). The first module is fluidly connected to the second module by at least one of the plurality of gas connection lines such that the abatement apparatus may receive the gas pumped from the entity by the vacuum pumping apparatus. Each of the gas connection lines comprises one or more sections, each section having a size, e.g. in the first system dimension, that is a respective integer multiple of the common fixed system value.

The present inventors have realised that, conventionally, for bespoke designed vacuum pumping and abatement system, it tends to be difficult to characterise or predict a temperature profile of gasses within the system, particularly prior to the vacuum pumping and abatement system being constructed or assembled. As such, once in operation, it may be realised that gas temperatures within the system are low enough such that one or more condensable substances within the gas condense to liquid or solid state, e.g. within the gas connection lines or pipes of the system. This condensing of the condensable substances may form blockages, restrict gas flow, and/or be detrimental to the operation of the system. This may also lead to less effective treatment of the process gas. Process gases output from semiconductor fabrication facilities tend to include condensable substances.

The present inventors have realised that using modules having a width that is an integer multiple of the same predetermined, common system value advantageously tends to provide that the lengths of the connection lines (e.g. the pipes, conduits, power lines, or anything else that is used in the vacuum pumping and/or abatement system) needed to connect together those modules have lengths that are also an integer multiple of the same predetermined common system value. Also, this tends to allow for the pre-manufacture of standardised modules and connections lines. This tends to allow for the characteristics and behaviour of the modules and connections lines to be more accurately determined or predicted, e.g. prior to assembly of the system. This tends to allow for the performance characteristics and behaviour of the overall vacuum pumping and abatement system to be more accurately and more easily determined or predicted. For example, it tends to be much easier to accurately characterise or predict a temperature profile of gasses within the system. This tends to facilitate designing the system to have a beneficial or preferred gas temperature profile, e.g. so as to reduce or eliminate the condensing in the system of condensable substances in the process gas. Also, thermal management of the system by a thermal management system to control the temperature profile of process gas within the system tends to be facilitated. Thus, advantageously the modular vacuum pumping and abatement system tends to alleviate or overcome the aforementioned issues.

The system may further comprise a thermal management system configured to manage a temperature of the gas within the system. The thermal management system may be configured to maintain a temperature of the gas within the system above a predefined threshold temperature (e.g. a temperature at which condensable substances in the gas condense). The thermal management system may comprise one or more devices selected from the group of devices consisting of temperature sensors, pressure sensors, heaters, and coolers. Each device may be operatively coupled to one of the functional modules or one of the gas connection lines. At least part of the thermal management system may be within a third module of the plurality of functional modules. The third module may be positioned adjacent to the first module and/or the second module in the first system dimension. The third module may have a maximum size in the first system dimension that is an integer multiple of the common fixed system value.

The first module may have a maximum size in the first system dimension that is a first integer multiple of a common fixed system value. The second module may have a maximum size in the first system dimension that is a second integer multiple of the common fixed system value. The second integer may be different to the first integer. The first integer and the second integer may be in the range 2 to 20.

A length of each gas connection line may be a respective integer multiple of the common fixed system value. The length may be in the first system dimension.

Each of the first and second modules may comprise a gas connection line input for receiving the gas into the module, a gas connection line output for exhausting the gas from the module, a facilities connection line input for receiving facilities conveyed from a source of facilities, and a frame for locating the vacuum pumping apparatus or the abatement apparatus of that module and the connection line input and output of that module in position in the module.

The plurality of functional modules may further comprise at least one further module. Each of the at least one further modules may be positioned adjacent to the first module and/or the second module in the first system dimension. Each of the at least one further modules may have a maximum size in the first system dimension that is a respective integer multiple of the common fixed system value. Each of the at least one further modules may be operatively coupled to the first module and the second module. Each of the at least one further modules may comprise apparatus selected from the group of apparatuses consisting of a vacuum pumping apparatus for pumping the gas from the entity, an abatement apparatus for abating the gas pumped from the entity, a facilities apparatus for receiving a second fluid and/or electrical power from a facilities supply and supplying that received second fluid and/or electrical power to another module, and a control apparatus for controlling operation of another module.

The system may further comprise one or more connection lines configured to connect together the plurality of functional modules, wherein a length of each connection line is a respective integer multiple of the common fixed system value, wherein the one or more connection lines are connection lines selected from the group of connection lines consisting of: a pipe for conveying a flow of fluid therethrough, a housing for an electrical conductor or optical fibre, an electrical conductor for electrical power or an electrical signal, and an optical fibre.

Sizes of each of the functional modules in a second system dimension may be substantially equal to each other, the second system dimension being perpendicular to the first system dimension. Each of the functional modules may have a maximum size in a second system dimension that is a respective integer multiple of the common fixed system value, the second system dimension being perpendicular to the first system dimension. Sizes of each of the modules in a third system dimension may be substantially equal to each other, the third system dimension being perpendicular to the first and second system dimensions. Each of the functional modules may have a maximum size in a third system dimension that is a respective integer multiple of the common fixed system value, the third system dimension being perpendicular to the first and second system dimensions.

In a further aspect, the present invention provides a method for evacuating and abating a gas from an entity. The method comprises: providing a first module, the first module comprising a vacuum pumping apparatus; providing a second module, the second module comprising an abatement apparatus; positioning the first module adjacent to the second module in a first system dimension, the first and second modules each having a maximum size in the first system dimension that is a respective integer multiple of a common fixed system value; fluidly connecting the first module to the second module by at least one gas connection line, each gas connection line comprising one or more sections, each section having a size that is a respective integer multiple of the common fixed system value; pumping, by the vacuum pumping apparatus, gas from the entity to the abatement apparatus; and abating, by the abatement apparatus, gas received from the vacuum pumping apparatus.

The method may further comprise controlling, by a thermal management system, a temperature of the gas within one or more of the first module, the second module, and the at least one gas connection line. The gas may comprise one or more condensable substances (e.g. substances that condense to liquid or solid state). The step of controlling may be performed to maintain a temperature of the gas above a threshold temperature at which the one or more condensable substances condense. The gas may be a process gas from a semiconductor fabrication facility.

In a further aspect, the present invention provides a vacuum pumping and/or abatement system for evacuating and/or abating fluid from an entity. The system comprises a first module comprising a vacuum pumping apparatus for pumping the fluid from the entity and/or an abatement apparatus for abating the fluid evacuated from the entity, and a second module arranged adjacent to the first module in a first system dimension. The first and second modules each have a maximum size in the first system dimension that is a respective integer multiple of a common fixed system value.

The common fixed system value may be a value in the range 10 mm-200 cm, or in the range 10 mm-5 cm, for example 44 mm.

The first module may have a maximum size in the first system dimension that is a first integer multiple of the common fixed system value, the first integer being an integer in the range 1 to 30. The first integer may be in the range 2 to 20. The second module may have a maximum size in the first system dimension that is a second integer multiple of the common fixed system value, the second integer being an integer in the range 1 to 30. The second integer may be in the range 2 to 20.

The second module may comprise apparatus selected from the group of apparatuses consisting of: a vacuum pumping apparatus for pumping the fluid from the entity; an abatement apparatus for abating the fluid pumped from the entity, a facilities apparatus for receiving a second fluid and/or electrical power from a facilities supply and supplying that received second fluid and/or electrical power to the first module, and a control apparatus for controlling operation of the first module.

The system may further comprise one or more connection lines configured to connect the first module to the second module, wherein a length of each connection line is a respective integer multiple of the common fixed system value. The one or more connection lines may be selected from the group of connection lines consisting of: a pipe for conveying a flow of fluid therethrough, a housing for an electrical conductor or optical fibre, an electrical conductor for electrical power or an electrical signal, and an optical fibre.

The system may further comprise one or more further modules, wherein the first module, the second module, and the one or more further modules are arranged one adjacent another in the first system dimension, and wherein each of the one or more further modules has a maximum size in the first system dimension that is a respective integer multiple of the common fixed system value.

Sizes of each of the modules in a second system dimension may be substantially equal to each other, the second system dimension being perpendicular to the first system dimension. Sizes of each of the modules in a third system dimension may be substantially equal to each other, the third system dimension being perpendicular to the first and second system dimensions.

In a further aspect, the present invention provides a modular system for forming a vacuum pumping and/or abatement system. The modular system comprises a plurality of functional modules and a plurality of connection lines. At least one of the modules comprises: a vacuum pumping apparatus or an abatement apparatus configured to, when connected to an entity remote entity from the vacuum pumping and/or abatement system or to another module in the vacuum pumping and/or abatement system, perform a vacuum pumping or an abatement function; a gas connection line input for receiving gas into the module; a gas connection line output for exhausting gas from the module; a facilities connection line input for receiving facilities conveyed from a source of facilities; and a frame for locating the vacuum pumping apparatus or the abatement apparatus of that module and the connection line inputs and output in position in the module. The modules are configured to be positioned one adjacent another in a first system dimension. The connection lines are configured to connect together modules, when those modules are positioned one adjacent another in the first system dimension so as to form a vacuum pumping and/or abatement system. Each of the modules has a maximum size in the first system dimension that is a respective integer multiple of a common fixed system value.

In a further aspect, the present invention provides a method for providing a vacuum pumping and/or abatement system, the method comprising: providing a first module, the first module comprising a vacuum pumping apparatus for pumping fluid or an abatement apparatus for abating fluid; positioning a second module adjacent to the first module in a first system dimension; and connecting together the first and second modules. The first and second modules each have a maximum size in the first system dimension that is a respective integer multiple of a common fixed system value.

In a further aspect, the present invention provides a vacuum pumping system for evacuating fluid from a processing apparatus, said vacuum pumping system comprising: a plurality of discrete units arranged one adjacent another in a first system dimension, the units comprising respective vacuum pumping and/or abatement components for pumping and/or abating gas from the processing apparatus; and a plurality of connection lines connecting the units of the system for the flow of fluid to or from the units; wherein the units each have a size in the first system dimension (e.g. a width) that is equal to or an integer multiple of a fixed system value and the connection lines comprise one or more sections having a size in the first system dimension that is equal to or an integer multiple of the fixed system value.

The fixed system value may be equal to or greater than 10 mm, preferably equal to or greater than 20 mm, more preferably equal to or greater than 40 mm and still more preferably equal to or greater than 44 mm. The fixed system value may be at least an order of magnitude greater than the accumulated manufacturing tolerances of the connection lines of the system.

The connection lines may further comprise electrical conductors for conveying electrical power or an electrical signal. The units may comprise connection points for connecting the or each of the unit's vacuum pumping or abatement components to one or more connection lines and the connection points are located in the first dimension a value equal to or an integer multiple of the fixed system value. A connection line may connect two units together at respective connection points and distance between the connection points and the length of the connection line are both equal to an integer multiple of the fixed system value. At least one connection line may be a correcting connection line that comprises at least one correction section for correcting the connection line for manufacturing tolerances. Said at least one correcting connection line may comprise two correcting sections each comprising a first and second end portions having respective longitudinal axes that are not coaxial and a central portion connecting the end portions.

The vacuum pumping system may further comprise a facilities unit for connection to a source of facilities of a processing apparatus and the connection lines comprise a facilities connection line for conveying facilities from the facilities unit to one or more vacuum pumping or abatement units, wherein said facilities unit has a size in the first system dimension that is equal to or an integer multiple of said fixed system value. The facilities unit may comprise at least one controller to control and/or monitors supply of facilities to the vacuum pumping or abatement units. Facilities may comprise one or more of nitrogen, clean dry air, coolant, electrical signals for controlling or monitoring system operation, fuel for burning, a plasma gas for forming a plasma, and air or oxygen for supporting combustion. The facilities unit may be configured to act as a datum unit for the other units of the system such that the facilities unit is the first of the units to be installed and each subsequently installed unit is installed relative to the facilities unit.

In a further aspect, the present invention provides a modular system comprising: a plurality of functional units comprising vacuum pumping or abatement units; a plurality of connection lines for connecting to said functional units in an installed vacuum pumping system for forming any one of a plurality of different installed systems for evacuating and/or abating gas from any one of a plurality of different respective process apparatus depending on the units and connecting lines selected from the modular system; wherein each of the vacuum pumping or abatement units comprises: a vacuum pumping or abatement arrangement arranged to perform a vacuum pumping or an abatement function when connected to the process assembly or another unit in an installed system, a gas connection line input for receiving gas into the unit; a gas connection line output for exhausting gas from the unit; a facilities connection line input for receiving facilities conveyed from a source of facilities; a power connection line input for receiving power conveyed from a source of power; and a unit frame for each unit for locating the vacuum pumping or abatement arrangements and the connection line inputs and output in position in the unit; and a support structure co-operable with the unit frames for locating the units of the system next to another unit of the system in at least a first dimension of an installed system. The system support structure may be co-operable with the unit frames to form a series of units abutting against another in at least said first dimension of an installed system.

The modular system may further comprise a facilities unit for supplying facilities to functional units of an installed vacuum pumping system. The facilities unit may be for providing facilities such as purge gas, coolant, clean dry air or low power. The connection lines may comprise fluid ducts for connecting to the functional units for conveying gas to or from the functional units and electrical conductors for conveying power to the functional units or signals to or from the functional units for controlling or monitoring the functional units.

A system value 'x' may be predetermined for the system and the connecting lines or sections of the connecting lines may have a length equal to an integer multiple of 'x' and the units have a width equal to an integer multiple of 'x', which may be determined by calculating the greatest common integer divisor of all units in the modular system. 'x' may be greater than 10 mm, preferably greater than 20 mm, more preferably greater than 40 mm and more preferably equal to or greater than 44 mm.

The modular system may comprise a plurality of sets of units, wherein units within a set are the same as one another having the same pumping characteristics, and the units within different sets are different from one another having different pumping characteristics, so the units can be selected depending on the varying vacuum pumping requirements of different processing apparatus. The vacuum pumping characteristics may include pressure and flow (or pumping speed/capacity) for a process chamber or each of the process chambers of a processing apparatus. A vacuum pumping arrangement may comprise a single vacuum pump or a plurality of vacuum pumps configured in series and/or parallel. The pump or pumps selected may comprise any one or more of the following vacuum pumping mechanisms: turbo molecular, drag, scroll, screw, Roots, claw or rotary vane. The abatement arrangement of a unit may comprise a combustor or plasma burner. The connection lines may include at least one adjusting connection line configured to connect between non-aligned connection points. Said at least one adjusting connection line may have a first end portion having a longitudinal axis and a second end portion having a longitudinal axis that is offset with respect to said longitudinal axis of said first end portion and a connecting portion connecting said first and second end portions.

In a further aspect, the present invention provides a method of assembling a vacuum pumping and/or abatement system from a modular system comprising a plurality of discrete functional modules having a respective pumping or abatement function independent of the other said functional modules and a facilities module to configured to connect facilities supplies to said functional modules, the method comprising: selecting one of the modules as a datum module for the system; installing the datum module in a required position; installing one or more further said modules to the system in series with said datum module.

The one or more further modules may be located in fixed relation to the datum module by: for a first further module to be installed abutting the first further module against the datum module in side-by-side relationship; and for each subsequent further module abutting in side-by-side relationship against the datum module or a previously further module. Said modules may each comprise a support structure which is arranged to abut against the support structure of an abutting module and be fixed in location when abutting, the support structure being co-operable with a module frame for fixing the module frame to the support structure. The module frames may be spaced apart when installed and fixed to the support structures.

The method may further comprise, when the datum module is installed, installing the support structures in position in fixed relation to one another and then installing the module frames consecutively in series to their respective support structures.

The facilities module may be the datum module. The facilities module once installed may be in a condition to receive facilities from a source of facilities prior to installation of the module frames of other modules of the system.

DETAILED DESCRIPTION

Figure 1:
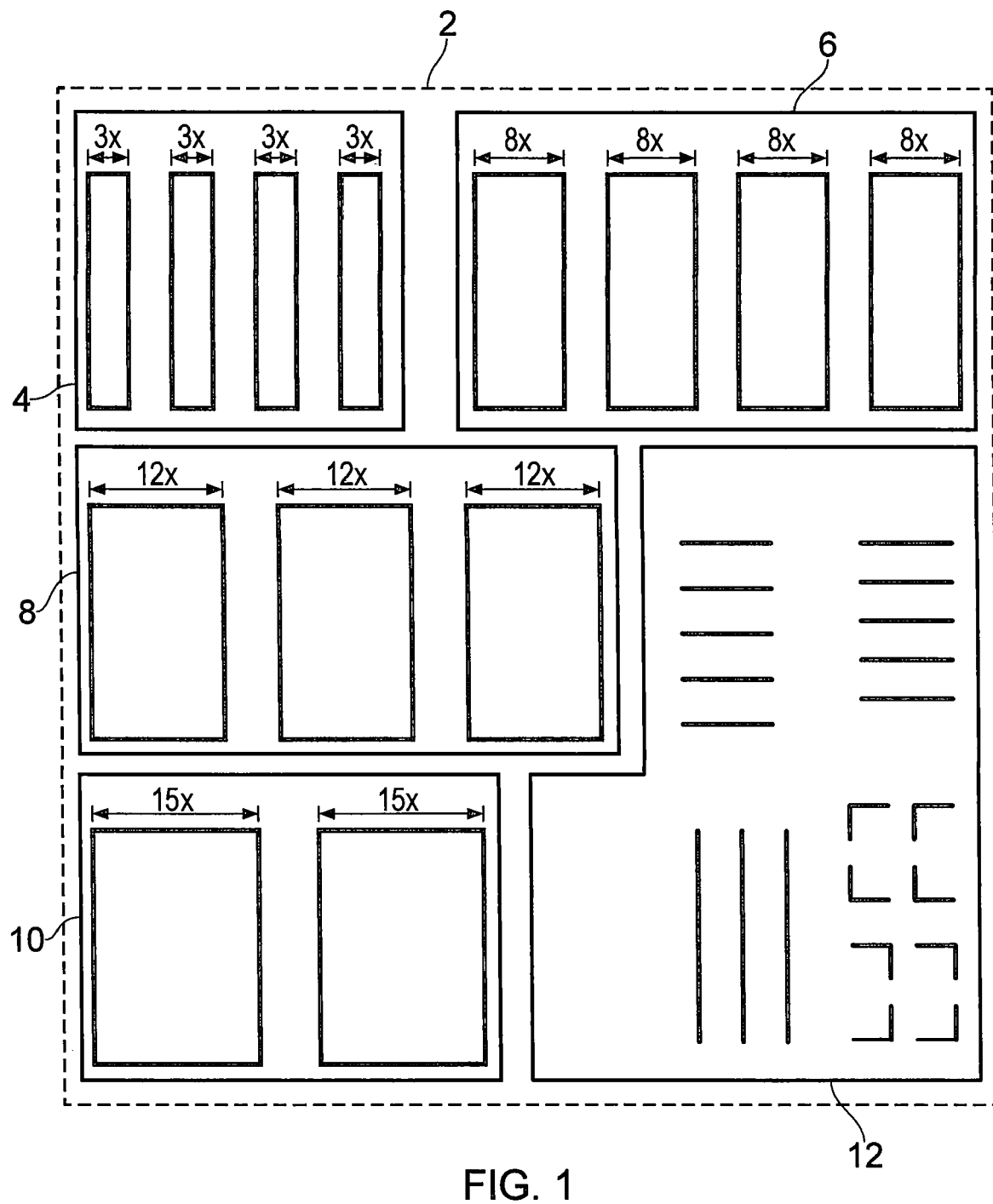
FIG. 1 is a schematic illustration (not to scale) showing a modular system.

FIG. 1 is a schematic illustration (not to scale) showing a modular system 2. The modular system 2 comprises pluralities of modules 4, 6, 8, 10 and a plurality of connection lines or pipes 12.

The modules may be referred to as "units" of the modular system 2. An example module from a plurality of modules 4, 6, 8, 10 is described in more detail later below with reference to FIG. 2.

In this embodiment, each module of each of the pluralities of modules 4, 6, 8, 10 comprises one or more apparatuses. Example apparatuses include, but are not limited to, vacuum pumping apparatuses for generating a vacuum pressure and fluid flow, abatement apparatuses for abating particular gases, facilities apparatuses for providing to the modules facilities such as cooling water, clean dry air and power lines for module subsystems, control apparatuses for controlling module operations, and thermal management apparatuses for controlling the temperature of gas, e.g. within another module or a connection gas line between two modules.

The modules are configured to be connected together by connection lines selected from the plurality of connection lines 12. The connection lines of the plurality of connection lines 12 are described in more detail later below with reference to FIGS. 3 and 4. The modules are configured to be connected together by connection lines to form a vacuum pumping system and/or abatement system. An example vacuum pumping system and/or abatement system is described in more detail later below with reference to FIGS. 5 and 6.

The modules may be connected together by the connection lines in multiple different configurations. In other words, the modules may be connected together by the connection lines so as to form any one of a plurality of different vacuum pumping and/or abatement systems depending on the modules and connection lines selected from the modular system 2. The selected modules and connection lines once arranged form the vacuum pumping system and/or abatement system for evacuating gas from one or more processing chambers, such as the processing chambers of a semiconductor fabrication assembly, or other entity. Additionally, the connection lines are configured to connect the vacuum pumping system and/or abatement system (i.e. the connected together modules) to facilities lines for supplying facilities to the vacuum pumping system and/or abatement system.

In this embodiment, each module has a width (or other dimension, but for sake of convenience it shall be referred to as a lateral dimension or more simply a 'width') which is equal to an integer multiple of a common system value, hereinafter referred to as "x" (e.g. x, 2x, 3x, 4x, and so on). In this embodiment, the width of a module is its maximum lateral dimension, and one or more portions of a module may have a lateral size that is less than the (maximum) width of the module.

In this embodiment, each module in the first plurality of modules 4 has a width equal to 3x. Each module in the second plurality of modules 6 has a width equal to 8x. Each module in the third plurality of modules 8 has a width equal to 12x. Each module in the fourth plurality of modules 10 has a width equal to 15x.

Also, in this embodiment, each connection line has a length (or other dimension, but for sake of convenience it shall be referred to as a longitudinal dimension or more simply a 'length') which is equal to an integer multiple of the common system value "x" (e.g. x, 2x, 3x, 4x, and so on).

The value x may be, for example, a value in the range 10 mm-200 cm, or more preferably 10 mm-100 cm, or more preferably 10 mm-90 cm, or more preferably 10 mm-50 cm, or more preferably 10 mm-20 cm, or more preferably 10 mm-10 cm, or more preferably 10 mm-5 cm, or more preferably 20 mm-50 mm, or more preferably 30 mm-40 mm. Example x values include, but are not limited to, 10 mm, 11 mm, 22 mm, 40 mm, 41 mm, 42 mm, 43 mm, 44 mm, 45 mm, 46 mm, 47 mm, 48 mm, 49 mm, 50 mm, 88 mm, 176 mm, 352 mm, 704 mm, 11 cm, 22 cm, 100 cm, 175 cm, 200 cm, etc. Preferably, x is equal to 44 mm or about 44 mm. The exact value chosen for 'x' tends not to be critical and any appropriate value can be chosen.

Figure 2:
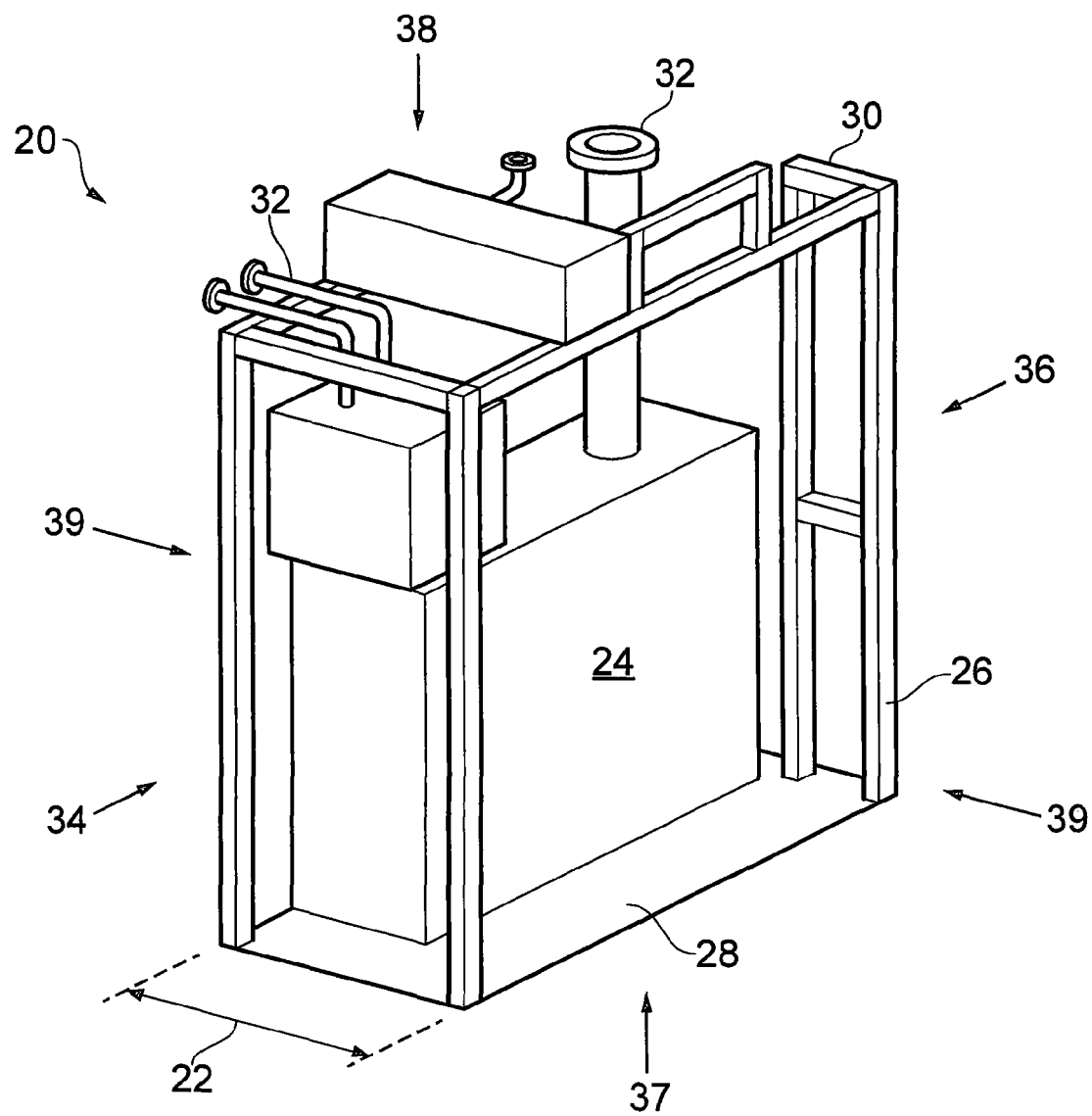
FIG. 2 is a schematic illustration (not to scale) showing a perspective view of a module of the modular system.

FIG. 2 is a schematic illustration (not to scale) showing a perspective view of an example module 20 of the modular system 2, which may be used to form the vacuum pumping and/or abatement system. In this example, the module 20 is a module from the first, second, third or fourth pluralities of modules 4, 6, 8, 10, having a width 22 equal to 3x, 8x, 12x or 15x, respectively.

The module 20 comprises one or more apparatuses 24. Each apparatus 24 is configured to perform a respective function within the vacuum pumping and/or abatement system. For example, an apparatus 24 may be a vacuum pump for pumping gas out of a processing chamber, an abatement unit for abating undesirable substances in the process gas, an inverter for converting DC electrical power into AC electrical power, an electronic control unit for controlling operation of some or all of the vacuum pumping and/or abatement system or a facilities apparatus for controlling or distributing a supply of facilities fluid (e.g. air or water) to other apparatuses. However, the one or more apparatuses 24 are not limited as such. In general, each of the one or more apparatuses 24 may be any apparatus which is used in a vacuum pumping and/or abatement system. In some embodiments, two or more of the apparatuses 24 are substantially identical and/or perform substantially the same function as each other.

The module 20 comprises a frame 26 coupled to a base 28. The one or more apparatuses 24 are disposed at least partially, and more preferably wholly, within the volume defined by the frame 26 and the base 28. The frame 26 comprises a plurality of interconnected bars 30 coupled to the base 28. In some embodiments, the base 28 of the module 20 provides a support structure, or docking structure, into which the frame 26 and the rest of the module 20 may be docked. The base 28 may be adapted to be fixed to the ground. The width of the base 28 may be an integer multiple of the common system value "x".

The module 20 also comprises lines, hereinafter referred to as module lines 32. The module lines 32 may include connections or pipes (e.g. metal or polymer pipes) configured to permit the flow of fluid (e.g. process gas or facilities fluid) therethrough and/or house or contain electrical or optical connections such as wires or optical fibres. The module lines 32 may include electrical or optical connections such as wires or optical fibres. In this embodiment, at least one of the module lines 32 is configured to receive fluid from one or more fluid sources (not shown in FIG. 2), direct flow of fluid through the module 20, and discharge fluid out of the module 20. For example, the module lines 32 may include piping configured to receive gas pumped from one or more processing chambers or other entities by a vacuum pump within the module 20, direct the pumped gas through the module 20, and discharge the pumped gas out of the module 20 (e.g. to another module or out of the system entirely). The module lines 32 may include piping which is configured to receive facilities fluid (e.g. nitrogen, clean dry air, coolant, electrical signals for controlling or monitoring system operation, fuel for burning, a plasma gas for forming a plasma, and air or oxygen for supporting combustion) from a source of facilities fluid, direct the facilities fluid through the module 20, and discharge the facilities fluid out of the module 20 (e.g. to another module or out of the system entirely). The module lines 32 may include electrical or optical connections from a location remote from the module 20 (e.g. a controller or processor located in a different module or remotely from the system) to the one or more apparatuses 24 of the module 20. At least one of the module lines 32 of the module 20 is fluidly connectable to the module lines of another module, as described in more detail later below with reference to FIGS. 5 and 6.

In this embodiment, the module lines 32 include a gas connection line input for receiving gas (e.g. processes gas) into the module 20. In this embodiment, the module lines 32 include a gas connection line output for exhausting gas (e.g. processes gas) from the module 20. In this embodiment, the module lines 32 include a facilities connection line input for receiving facilities fluids conveyed from a facilities fluid supply.

In this embodiment, the module lines 32 include a power connection line input for receiving electrical power conveyed from a source of electrical power.

The frame 26 locates the one or more apparatuses 24, and the connection line inputs and outputs at known relative positions in the module.

The module 20 has a front side 34, a rear side 36, a top side 38, a bottom side 40, and two opposing lateral sides 42.

The width of the module 20 is the maximum size of the module in the lateral dimension (i.e. in the direction between the lateral sides 42 of the module 20). This width is an integer multiple of the common system value x. In some embodiments, the width of the base 28 defines the width of the module 20.

The height of the module 22 is the distance between the top side 38 and the bottom side 40. In this embodiment, the heights of all of the modules in the modular system 2 are substantially equal to each other and may be, for example 190 cm-200 cm, e.g. about 198 cm.

The depth of the module 22 is the distance between the front side 34 and the rear side 36. In this embodiment, the depths of all of the modules in the modular system 2 are substantially equal to each other and may be, for example 130 cm-140 cm, e.g. about 134 cm.

As described in more detail later below with reference to FIGS. 5 and 6, the module 20 is configured to be attached to one or more other modules 20 via either or both of its lateral sides 42 in order to construct the vacuum pumping and/or abatement system.

The base 28 of the frame 26 is disposed at the bottom side 40.

In this embodiment, at least some of the module lines 32 extend out of the space defined by the frame 26 at the top side 38 of the module 20. This advantageously tends to facilitate connection of the module 20 to other modules and/or facilities connections by the connection lines.

Figure 3:
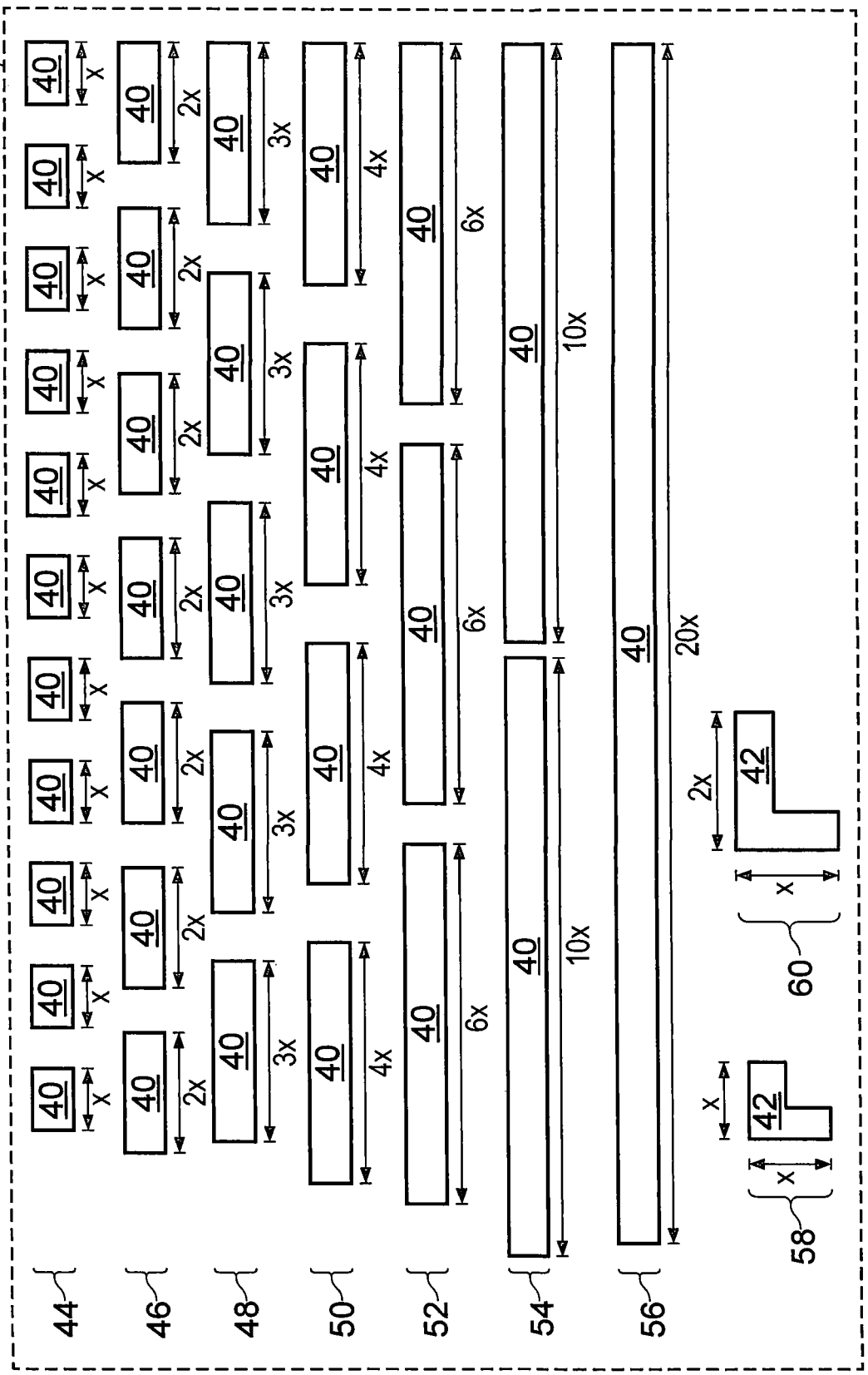
FIG. 3 is a schematic illustration (not to scale) showing connection lines of the modular system.

FIG. 3 is a schematic illustration (not to scale) showing certain connection lines of the plurality of connection lines 12, in particular a selection of substantially straight connection lines 40, and a plurality corner or "bend" connection lines 42.

The connection lines may include, for example, pipes for conveying fluid, housings (e.g. tubes) for containing electrical conductors or optical fibres, electrical conductors, and optical fibres.

In some embodiments, at least some of the connection lines of the plurality of connection lines 12 are substantially rigid.

The straight connection lines 40 provide a plurality of discrete connection components. In this embodiment, each of the straight connection lines 40 has a length that is substantially equal to an integer multiple of the common system value x. The straight connection lines 40 are grouped into different groups, each group containing straight connection lines 40 of a respective length. A first group 44 includes those straight connection lines 40 that have a length equal to x. A second group 46 includes those straight connection lines 40 that have a length equal to 2x. A third group 48 includes those straight connection lines 40 that have a length equal to 3x. A fourth group 50 includes those straight connection lines 50 that have a length equal to 4x. A fifth group 52 includes those straight connection lines 40 that have a length equal to 6x. A sixth group 54 includes those straight connection lines 40 that have a length equal to 10x. A seventh group 56 includes those straight connection lines 40 that have a length equal to 20x. In other embodiments, straight connection lines having lengths that are a different integer multiple of the common system value x may be used. For example, straight connection lines having lengths equal to x, 2x, 3x, 4x, 5x, 7x, 8x, 9x, 10x, 11x, 12x, 13x, 14x, 15x, 16x, 17x, 18, 19x, 20x, and/or more than 20x may be used.

The corner connection lines 42 provide a plurality of discrete connection components. The corner connection lines 42 may be right-angled as shown or may subtend other angles greater or less than 90°. In this embodiment, each corner connection line 42 comprises two straight portions (which may be of equal length or of different length) coupled at a corner. In this embodiment, each of the straight portions of each of the corner connection lines 42 has a length that is substantially equal to an integer multiple of the common system value x. The corner connection lines 40 are grouped into different groups, each group containing corner connection lines 40 having substantially the same size and shape. An eighth group 58 includes those corner connection lines 42 that have a first straight portion of length x and a second straight portion of length x. A ninth group 60 includes those corner connection lines 42 that have a first straight portion of length x and a second straight portion of length 2x. Preferably, there are provided a plurality of differently sized corner components connection lines 42. In other embodiments, corner connection lines having straight portions having lengths that are a different integer multiple of the common system value x may be used. For example, corner connection lines may have straight portions, each straight portion having a length selected from the group of lengths consisting of x, 2x, 3x, 4x, 5x, 7x, 8x, 9x, 10x, 11x, 12x, 13x, 14x, 15x, 16x, 17x, 18, 19x, 20x, and/or more than 20x.

The corner connection lines 42 may be used to connect other components (e.g. straight connection lines 40) which are not aligned or are at an angle to each other.

Advantageously, a connection line of a desired length (the desired length being an integer multiple of the common system value x) may be provided by selecting appropriate connection lines 40, 42 from the groups 44-60 and connecting those selected connection lines 40, 42 together to provide a connection line having a total length equal to the desired length.

Figure 4:
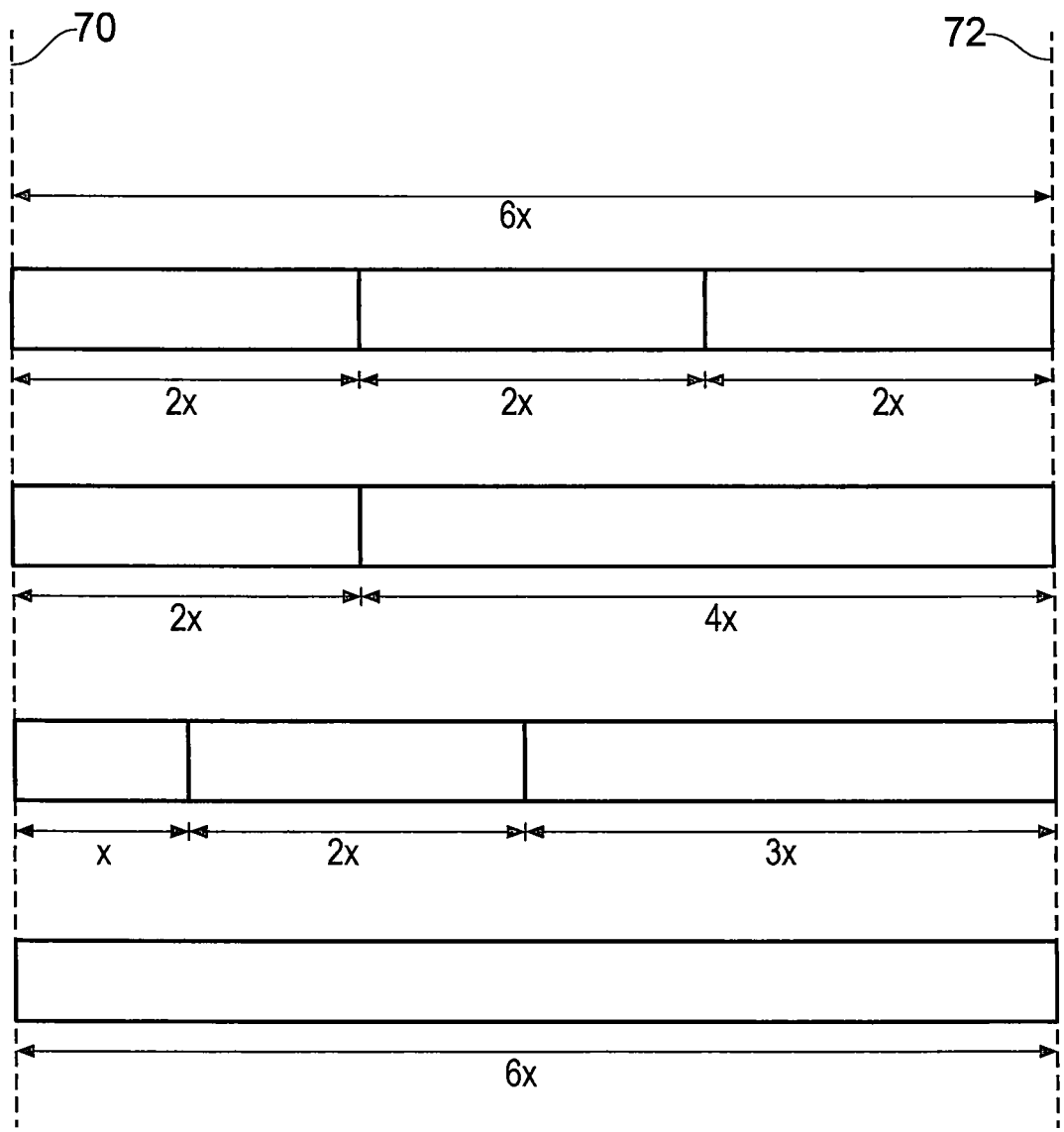
FIG. 4 is a schematic illustration (not to scale) showing some examples of connection lines joined together.

FIG. 4 shows some examples of connection components joined together to form a connection line having a total length of 6x between interface planes 70, 72. There is a multiplicity of different ways of selecting connection components to form a desired length and in FIG. 4 four possibilities are shown for producing a length 6x, namely: $2x+2x+2x=6x$, $2x+4x=6x$, $3x+2x+x=6x$ and $6x=6x$.

Figure 5:
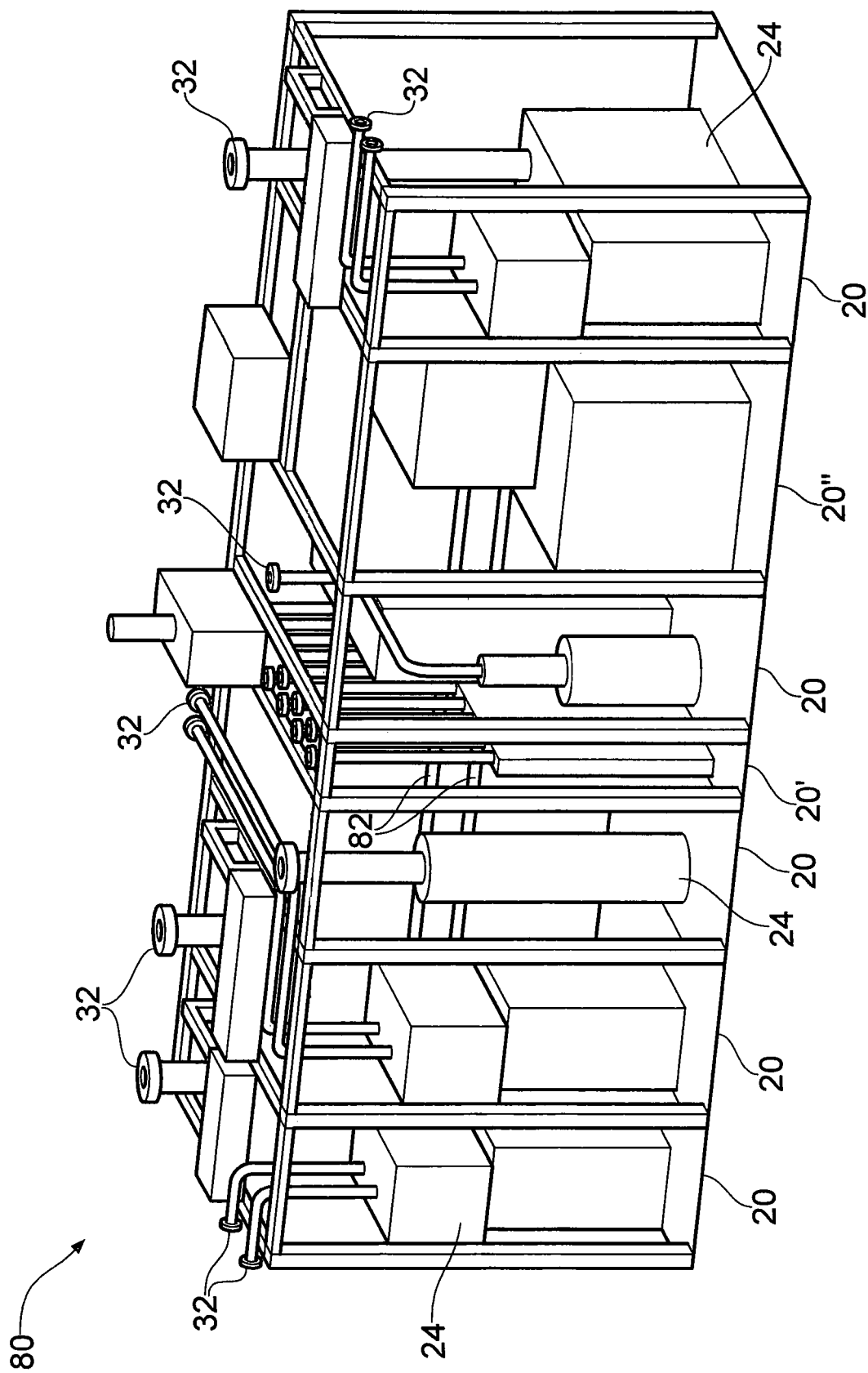
FIG. 5 is a schematic illustration (not to scale) showing a perspective view of a vacuum pumping and/or abatement system formed from modules and connection lines of the modular system.

FIG. 5 is a schematic illustration (not to scale) showing a perspective view of the vacuum pumping and/or abatement system 80 formed from a plurality of modules 20. One or more of the modules 20 that forms the system 80 may have a different width to one or more of the other modules 20 of the system 80 or, alternatively, the modules 20 of the system 80 may have substantially the same widths as each other. That being said, each module 20 nevertheless has a width that is an integer multiple of the common system value x.

In this embodiment, the modules 20 are connected together in a side-by-side, contiguous arrangement. Each module 20 is attached to one or more adjacent modules 20 at one or both of its lateral sides 42.

As described in more detail earlier above with reference to FIG. 2, each module comprises module lines 32. In addition, the modules 20 are connected together by further lines, hereinafter referred to as system lines 82. The system lines 82 are formed by connection lines 40, 42 of appropriate lengths selected from the of the plurality of connection lines 12.

The system and module lines 82, 32 provide lines that permit the flow of fluid therethrough and/or electrical or optical connections such as wires or optical fibres. The system lines 82 comprise lines which are external to the modules 20 and which are used to connect the modules 20 to each other. More specifically, the system lines 82 may fluidly connect the modules 20 together in series or in parallel in order to allow fluid to flow through the system 80 via the modules 20.

Figure 6:
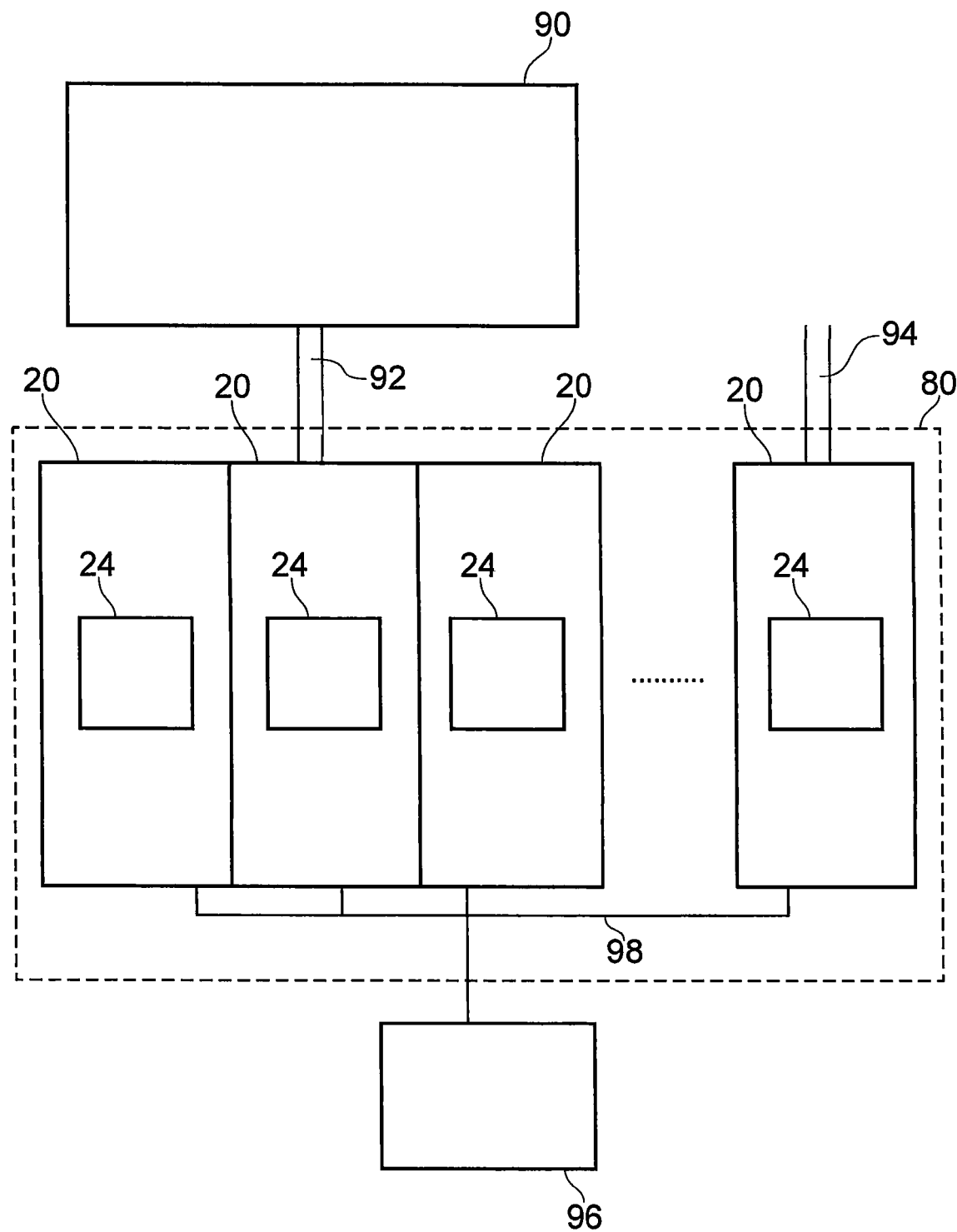
FIG. 6 is a schematic illustration (not to scale) showing the installed vacuum pumping and/or abatement system.

FIG. 6 is a schematic illustration (not to scale) showing the vacuum pumping and/or abatement system 80 in operation.

The system 80 is fluidly connected to an entity 90 via a fluid connection 92, commonly referred to as a "foreline", between the system 80 and the entity 90. The entity 90 may, for example, be a chamber or room used in an industrial process such as semiconductor fabrication.

The system 80 is also fluidly connected to an exhaust line 94.

The system 80 is also connected to a facilities supply 96 via facilities connection lines 98. The facilities connection lines 98 may be formed by connection lines 40, 42 of appropriate lengths selected from the of the plurality of connection lines 12.

In operation, the system 80 pumps gas out of the entity 90 and/or abates (e.g. destroy or dispose of) undesirable substances produced by the entity 90 which may be present in that process gas. The system 80 also pumps the gas (which may have undergone an abatement process by an abatement apparatus of the system 80) out of the exhaust line 94. The process gas from the entity 90 (e.g. the semiconductor fabrication facility) may include one or more condensable substances that may condense from the gas at or below a threshold temperature.

Also in operation, the system 80 receives facilities such as cooling water, clean dry air, electrical power, and/or optical signals from the facilities supply 96 via facilities connection lines 98. These facilities allow for proper operation of the apparatuses of the module 20. In some embodiments, the facilities are received from the facilities supply 96 by one or more facilities apparatuses of one or more of the modules 20, and subsequently distributed to other apparatuses/modules in the system by that one or more facilities apparatuses via system and/or module lines 82, 32.

The vacuum pumping and/or abatement system 80 may comprise a thermal management system. For example, an apparatus 24 of the system 80 may be a thermal management system. Alternatively, the thermal management system may be external to the modules 20. The thermal management system may comprise one or more processors and controllers configured to manage a temperature of the process gas within the system 80.

In some embodiments, the system 80 comprises one or more temperature sensors configured to measure temperatures of the gas within the system, e.g. within the foreline 92, within the exhaust line 98, or within a gas connection line between modules 20. In some embodiments, the system 80 comprises one or more pressure sensors configured to measure pressures of the gas within the system, e.g. within the foreline 92, within the exhaust line 98, or within a gas connection line between modules 20.

In some embodiments, the thermal management system is configured to receive measurements from the one or more temperature sensors, the one or more pressure sensors, and/or operation data from one or more of the apparatuses 24. The thermal management system may be configured to determine or estimate a temperature profile of the process gas with at least a part of the system 80, e.g. using the received measurements and/or data. The thermal management system may be configured to maintain a temperature of the gas within at least a part (e.g. all) of the system above a predefined threshold temperature, for example based on the determined or estimated temperature profile. In some embodiments, the predefined threshold temperature is a temperature at which one or more condensable substances in the process gas condense.

In some embodiment, the system comprises one or more heaters arranged to heat the gas at respective positions within the system 80. A heater may be located within a frame of a module 20. In some embodiment, the system comprises one or more coolers (e.g. heat sinks, thermoelectric coolers, forced air systems, fans, etc.) arranged to cool the gas at respective positions within the system 80. A cooler may be located within a frame of a module 20. The thermal management system may be configured to control the temperature of the of the gas within the system by controlling the one or more heaters and/or the one or more coolers.

Advantageously, using modules having widths that are an integer multiple of the common system value x connected together by connection lines having lengths that are also an integer multiple of the same common system value x tends to allow for the pre-manufacture of standardised modules and connections lines. This tends to facilitate the determination or prediction of how the modules and connections lines behave in the system. In other words, operational characteristics of the modules and connections lines tend to be easier to predict, e.g. prior to assembly of the system 80. This tends to allow for the performance characteristics and behaviour of the overall vacuum pumping and abatement system 80 to be more accurately and more easily determined or predicted. For example, it tends to be much easier to accurately characterise or predict a temperature profile of gasses within the system 80. This tends to facilitate designing the system to have a beneficial or preferred gas temperature profile, e.g. so as to reduce or eliminate the condensing in the system of condensable substances in the process gas. Also, this advantageously tends to facilitate the thermal management of the system 80 by the thermal management system to control the temperature profile of process gas within the system, e.g. so as to avoid condensation of the process gas condensables.

Conventionally, the condensing of condensable substances from the pumped process gas into solid or liquid states may form blockages, restrict gas flow, and/or be detrimental to the operation of the system. This may also lead to less effective treatment of the process gas. The above described system advantageously tends to reduce or eliminate such issues.

Thus, a modular system for constructing a vacuum pumping and/or abatement system is provided.

Advantageously, modules and connection lines can be easily and efficiently arranged and attached together to provide multiple different system configurations, thereby to readily meet different vacuum pumping and/or abatement requirements.

There are numerous ways in which a vacuum pumping and/or abatement system can be arranged in order to meet the various different requirements for an assembly. The required pumping and/or abatement characteristics depend on such things as the processes being performed in one or more process chambers and the process gases used. The pumping characteristics include, amongst other parameters, pressure and flow (or pumping speed/capacity) for one process chamber or each of the process chambers.

The required pumping and/or abatement characteristics may be achieved by selecting particular vacuum pumping and/or abatement modules from the modular system. Each module in a set/group of modules is configured to incorporate a vacuum pumping and/or abatement arrangement having particular pumping and/or abatement characteristics. The modules within a set may be the same as one another (i.e. have the same pumping and/or abatement characteristics), and the modules of different sets may be different from one another (i.e. have different pumping and/or abatement characteristics), so the modules can be selected depending on the varying requirements of a processing apparatus. In some modules there is a plurality of vacuum pumping arrangements. A vacuum pumping arrangement may comprise a single vacuum pump or a plurality of vacuum pumps configured in series and/or parallel. The pump or pumps selected may comprise without limitation any one or more of the following vacuum pumping mechanisms: turbo molecular, drag, scroll, screw, roots, claw or rotary vane.

The modules can be manufactured and prepared in advance of the system being designed and installed, thereby reducing cost and lead time.

Each module having a width that is an integer multiple of the same predetermined, common system value x advantageously tends to provide that the lengths of the connection lines (e.g. the pipes, conduits, power lines, or anything else that is used in the vacuum pumping and/or abatement system) needed to connect together those modules have lengths that are also an integer multiple of the same predetermined common system value x. This tends to allow for the pre-manufacture of standardised connections lines, which tends to reduce assembly/installation time and cost. Furthermore, sections of connection lines for connecting the modules can be configured in advance of system installation thereby to further reduce installation time.

The space (or footprint) occupied by an installed vacuum pumping and/or abatement system tends to be an important factor in system design. A reduced footprint tends to lead to decreased costs and/or greater productivity. Advantageously, with the above-described modular system, each module and connection line can be designed, manufactured and assembled in advance of system definition and installation, and, when installed, occupies a defined space in the installed system. This approach tends to provide for reduced footprint of the overall system. Furthermore, predictability of the total footprint of the system is improved.

The size of a vacuum pumping arrangement is typically dependent on the pumping performance that it is required to achieve and as different vacuum pumping arrangements are required to achieve different pumping performance, modules in the system have different constraints on module size. The modules having a width dependent on the common, predetermined value 'x' tends to provide that the modules can be configured to occupy a minimum or reduced amount of space or footprint, and also tends to provide that the system comprising those modules can be configured to occupy a minimum or reduced amount of space or footprint.

In the above embodiments, the modular system comprises four pluralities of modules, each comprising modules of different respective widths, namely the first plurality of modules having modules of width 3x, the second plurality of modules having modules of width 8x, the third plurality of modules having modules of width 12x, and the fourth plurality of modules having modules of width 15x. However, in other embodiments, the modular system includes one or more modules having different widths to those listed earlier instead of or in addition to one or more of the modules in the first, second, third or fourth pluralities. For example, the modular system may include one or more modules, each module having a width selected from the groups of widths consisting of: x, 2x, 3x, 4x, 5x, 6x, 7x, 8x, 9x, 10x, 11x, 12x, 13x, 14x, 15x, 16x, 17x, 18x, 19x, 20x, 21x, 22x, 23x, 24x, 25x, 26x, 27x, 28x, 29x, 30x, and greater than 30x. Examples of modules that may be included in the modular system include, but are not limited, one or more modules having widths substantially equal to 3x (e.g. a facilities module of width 3x, where x=44 mm, and configured to receive facilities from an external facilities supply and distribute and control supply of facilities to other modules in the system), one or more modules having widths substantially equal to 8x (e.g. an abatement control module of width 8x, where x=44 mm), one or more modules having widths substantially equal to 10x (e.g. a module comprising one or two vacuum pumps, the module having a width of 10x, where x=44 mm), one or more modules having widths substantially equal to 12x (e.g. a module comprising one or two vacuum pumps, the module having a width of 12x, where x=44 mm), one or more modules having widths substantially equal to 14x (e.g. an abatement reactor module having a width of 14x, where x=44 mm), one or more modules having widths substantially equal to 15x (e.g. a module comprising one, two, or three vacuum pumps, the module having a width of 15x, where x=44 mm), one or more modules having widths substantially equal to 17x (e.g. a module comprising multiple vacuum pumps in a staggered arrangement, the module having a width of 17x, where x=44 mm), and one or more modules having widths substantially equal to 20x (e.g. an abatement reactor module having a width of 20x, where x=44 mm).

In the above embodiments, the heights of all of the modules in the modular system are substantially equal to each other and may be, for example 190 cm-200 cm, e.g. about 198 cm. When installed in a system, the height of a module may be greater than 198 cm, for example due to connection lines extending from a top of the module to connect that module to other modules. In some embodiments, one or more of the modules has a different height to one or more of the other modules. Also, in some embodiments, one or more (e.g. all) of the modules has a height other than 190 cm-200 cm. Preferably, each of the modules has a height that is substantially equal to an integer multiple of some common value, e.g. the common system value x or a value y that is different to x.

In the above embodiments, the depths of all of the modules in the modular system are substantially equal to each other and may be, for example 130 cm-140 cm, e.g. about 134 cm. However, in other embodiments, one or more of the modules has a different depth to one or more of the other modules. Also, in some embodiments, one or more (e.g. all) of the modules has a depth other than 130 cm-140 cm. Preferably, each of the modules has a depth that is substantially equal to an integer multiple of some common value, e.g. the common system value x, the value y, or a value z that is different to x and y.

In the above embodiments, the modular system comprises straight connection lines and corner connection lines. However, in other embodiments the modular system includes different shape connection lines instead of or in additional to one or more of the straight connection lines and corner connection lines. Examples of other connection lines that may be included in the modular system include, but are not limited to, S-bend components, rectilinear connection lines, and at least partially flexible connection lines (e.g. a hose).

In the above embodiments, the modular system comprises connection lines having the length and shapes described above with reference to FIGS. 3 and 4. However, in other embodiments, the modular system may comprise connection lines having different lengths instead of or in addition to one or more of those connection lines shown in FIGS. 3 and 4 and described in more detail above. For example, it may be determined that a connection line that is frequently used in an installed system has a length of 7x, 11x, 15x, or some other multiple of x, and in this case it may be desirable to manufacture connection lines having that length. It may be desirable to reduce the number of groups of differently sized connection lines. For example, it may not be desirable to produced connection lines having lengths of 6x, since such lines can be readily provided by joining components of, e.g., 3x. In embodiments in which connection lines include a seal carrier, preferably the lengths of those connection lines include any seal carrier.

Also, in some embodiments, the modular system may include one or more connection lines that have a length that is not an integer multiple of the common system value x. Bespoke components not based on the value x can, where required, be manufactured for any installed system. For example, corner connection and/or flexible gas conduits having lengths not based the value x may be used during installation for connecting adjacent connection lines. This advantageously tends to provide additional configurability of the system where desired, even whilst much of the system is pre-configured based on the common system value x.

In the above embodiments, the modules are arranged and connected together as described in more detail earlier above with reference to FIGS. 5 and 6. In particular, the modules are connected together in a side-by-side, contiguous arrangement, each module being is attached to one or more adjacent modules at one or both of its lateral sides. However, in other embodiments, the modules may be positioned or arranged, and connected together in a different way. For examples, in some embodiments, spaces or gaps exist between adjacent modules. Such spaces may facilitate access by a user, e.g. for performing servicing or maintenance operations. Preferably, the sizes of the spaces or gaps between adjacent modules are an integer multiple of the common system value x. This tends to facilitate connection between the spaced apart modules by the connection lines. In some embodiments, one or more modules may be attached to one or more adjacent modules at a side other than one of its lateral sides. For example, in some embodiments, a module is attached to a different module at its rear side.

The invention claimed is:

1. A modular vacuum pumping and abatement system for evacuating and abating a gas from an entity, the system comprising:
a plurality of functional modules; and
a plurality of gas connection lines, each of the gas connection lines for conveying a flow of gas therethrough; wherein
the plurality of functional modules comprises:
a first module comprising a vacuum pumping apparatus for pumping the gas from the entity; and
a second module comprising an abatement apparatus for abating the gas pumped from the entity;
the first module is positioned adjacent to the second module in a first system dimension;
the first and second modules each have a maximum size in the first system dimension that is a first respective integer multiple of a common fixed system value;
the first module is fluidly connected to the second module by at least one of the plurality of gas connection lines such that the abatement apparatus may receive the gas pumped from the entity by the vacuum pumping apparatus; and
each of the gas connection lines comprises one or more sections, each of the sections having a size that is a second respective integer multiple of the common fixed system value.

2. The system of claim 1, further comprising a thermal management system configured to manage a temperature of the gas within the system,
wherein the thermal management system is configured to maintain a temperature of the gas within the system above a predefined threshold temperature;
wherein the gas includes a mixture of substances comprising one or more condensable substances;
wherein the predefined threshold temperatures is above a temperature at which the one or more condensable substances condense.

3. The system of claim 2, wherein:
the thermal management system comprises one or more devices selected from the group of devices consisting of temperature sensors, pressure sensors, heaters, and coolers; and
each of the devices is operatively coupled to one of the functional modules or one of the gas connection lines.

4. The system of claim 2, wherein:
the thermal management system is within a third module of the plurality of functional modules;
the third module is positioned adjacent to the first module and/or the second module in the first system dimension; and
the third module has a maximum size in the first system dimension that is also a respective integer multiple of the common fixed system value.

5. The system of claim 1, wherein:
the first module has a maximum size in the first system dimension that is the first integer multiple of the common fixed system value; and
the second module has a maximum size in the first system dimension that is the second integer multiple of the common fixed system value, the second integer being the same as the first integer.

6. The system of claim 1, wherein
the first module has a maximum size in the first system dimension that is the first integer multiple of the common fixed system value; and
the second module has a maximum size in the first system dimension that is the second integer multiple of the common fixed system value, the second integer being different to the first integer.

7. The system of claim 6, wherein the first integer and the second integer are integers in the range 2 to 20.

8. The system of claim 1, wherein a length of each of the gas connection lines is also a respective integer multiple of the common fixed system value.

9. The system of claim 1, wherein each of the first and second modules comprise:
a gas connection line input for receiving the gas into that module;
a gas connection line output for exhausting the gas from that module;
a facilities connection line input for receiving facilities conveyed from a source of facilities; and
a frame for locating the vacuum pumping apparatus or the abatement apparatus of that module and the connection line input and output of that module in position in that module.

10. The system of claim 1, wherein the common fixed system value is a value in the range 10 mm-5 cm.

11. The system according to claim 1, wherein:
the plurality of functional modules further comprises at least one further module;
each of the at least one further modules is positioned adjacent to the first module and/or the second module in the first system dimension;
each of the at least one further modules has a maximum size in the first system dimension that is a respective integer multiple of the common fixed system value;
each of the at least one further modules is operatively coupled to the first module and/or the second module;
each of the at least one further modules comprises apparatus selected from the group of apparatuses consisting of a vacuum pumping apparatus for pumping the gas from the entity, an abatement apparatus for abating the gas pumped from the entity, a facilities apparatus for receiving a second fluid and/or electrical power from a facilities supply and supplying that received second fluid and/or electrical power to another module, and a control apparatus for controlling operation of another module.

12. The system of claim 1, further comprising one or more connection lines configured to connect together the plurality of functional modules, wherein a length of each of the connection lines is a respective integer multiple of the common fixed system value, wherein the one or more connection lines are connection lines selected from the group of connection lines consisting of: a pipe for conveying a flow of fluid therethrough, a housing for an electrical conductor or optical fibre, an electrical conductor for electrical power or an electrical signal, and an optical fibre.

13. The system of claim 1, wherein sizes of each of the functional modules in a second system dimension are substantially equal to each other, the second system dimension being perpendicular to the first system dimension.

14. The system of claim 13, wherein sizes of each of the functional modules in a third system dimension are substantially equal to each other, the third system dimension being perpendicular to the first and second system dimensions.

15. The system of claim 13, wherein each of the functional modules has a maximum size in a third system dimension that is a respective integer multiple of the common fixed system value, the third system dimension being perpendicular to the first and second system dimensions.

16. The system of claim 1, wherein each of the functional modules has a maximum size in a second system dimension that is a respective integer multiple of the common fixed system value, the second system dimension being perpendicular to the first system dimension.

17. A method for evacuating and abating a gas from an entity, the method comprising:
providing a first module, the first module comprising a vacuum pumping apparatus;
providing a second module, the second module comprising an abatement apparatus; positioning the first module adjacent to the second module in a first system dimension, the first and second modules each having a maximum size in the first system dimension that is a first respective integer multiple of a common fixed system value;
fluidly connecting the first module to the second module by at least one gas connection line, each gas connection line comprising one or more sections, each of the sections having a size that is a second respective integer multiple of the common fixed system value;
pumping, by the vacuum pumping apparatus, gas from the entity to the abatement apparatus; and
abating, by the abatement apparatus, gas received from the vacuum pumping apparatus.

18. The method of claim 17, further comprising controlling, by a thermal management system, a temperature of the gas within one or more of the first module, the second module, and the at least one gas connection line.

19. The method of claim 18, wherein:
the gas comprises a mixture including one or more condensable substances; and
the step of controlling the temperature is performed to maintain a temperature of the gas above a threshold temperature at which the one or more condensable substances condense.

20. The method of claim 17, wherein the gas is a process gas from a semiconductor fabrication facility.

* * * * *